(12) United States Patent
Chiodo

(10) Patent No.: US 9,110,132 B2
(45) Date of Patent: Aug. 18, 2015

(54) ELECTRICAL AND FLUID CONNECTION SYSTEM FOR MAGNETIC IMAGING

(76) Inventor: Chris Chiodo, Warren, MI (US)

( * ) Notice: Subject to any disclaimer, the term of this patent is extended or adjusted under 35 U.S.C. 154(b) by 642 days.

(21) Appl. No.: 13/566,787

(22) Filed: Aug. 3, 2012

(65) Prior Publication Data

US 2013/0033265 A1 Feb. 7, 2013

Related U.S. Application Data

(60) Provisional application No. 61/574,588, filed on Aug. 5, 2011.

(51) Int. Cl.
*G01R 33/30* (2006.01)
*G01R 33/36* (2006.01)

(52) U.S. Cl.
CPC ............... *G01R 33/30* (2013.01); *G01R 33/36* (2013.01)

(58) Field of Classification Search
CPC ................................ G01R 33/30; G01R 33/36
See application file for complete search history.

(56) References Cited

U.S. PATENT DOCUMENTS

| | | | | |
|---|---|---|---|---|
| 4,859,949 A * | 8/1989 | McKenna | ...................... | 324/321 |
| 6,396,274 B1 * | 5/2002 | Commens et al. | ............ | 324/321 |
| 6,593,743 B2 * | 7/2003 | de Swiet et al. | .............. | 324/318 |
| 6,867,594 B2 * | 3/2005 | Fey et al. | ...................... | 324/321 |
| 7,019,526 B2 * | 3/2006 | Lukens et al. | ................. | 324/321 |
| 7,023,210 B1 * | 4/2006 | Finnigan | ........................ | 324/318 |
| 7,064,549 B1 * | 6/2006 | Hudson | .......................... | 324/318 |
| 7,068,034 B2 * | 6/2006 | de Swiet | ........................ | 324/321 |
| 7,119,542 B1 * | 10/2006 | Howard et al. | ............... | 324/321 |
| 7,132,829 B2 * | 11/2006 | Hudson et al. | ................ | 324/318 |
| 7,135,865 B2 * | 11/2006 | Park et al. | ...................... | 324/321 |
| 7,138,801 B2 * | 11/2006 | Yamamoto et al. | ........... | 324/318 |
| 7,173,424 B2 * | 2/2007 | Saitoh et al. | ................... | 324/318 |
| 7,372,274 B2 * | 5/2008 | Ardenkjaer-Larsen et al. | .............................. | 324/321 |
| 7,414,403 B2 * | 8/2008 | Chiodo | .......................... | 324/321 |
| 7,521,929 B2 * | 4/2009 | Tsuchiya et al. | .............. | 324/309 |
| 7,619,414 B2 * | 11/2009 | Yamamoto et al. | ........... | 324/318 |
| 7,639,007 B2 * | 12/2009 | Hutton et al. | .................. | 324/307 |
| 7,639,014 B2 * | 12/2009 | Hasegawa et al. | ............ | 324/321 |
| 7,808,242 B2 * | 10/2010 | Yamamoto et al. | ........... | 324/318 |
| 7,812,606 B2 * | 10/2010 | Burns | ........................... | 324/318 |
| 8,547,099 B2 * | 10/2013 | Takegoshi et al. | ............ | 324/309 |
| 8,587,314 B2 * | 11/2013 | Burns | ........................... | 324/318 |
| 8,723,520 B2 * | 5/2014 | Nishihagi | ..................... | 324/309 |

* cited by examiner

*Primary Examiner* — Dixomara Vargas
(74) *Attorney, Agent, or Firm* — Lawrence J. Shurupoff

(57) ABSTRACT

Imaging signals from one or more surface coils are directed outwardly through a rear end portion of an imaging bore of an imaging machine, such as a magnetic resonance imaging machine (MRI). Initial processing of the imaging signals can be carried out within the imaging bore and transmitted through a pair of releasable connectors to external imaging processing equipment. By routing the surface coil imaging signals through the open rear end of an imaging bore, wires and other signal processing components need not be squeezed through the relatively limited space available around the front portion of an imaging bore. Fluid passages can be provided through the pair of releasable connectors for the passage of heating fluids, cooling fluids, and pressurized gasses including anesthesia gasses.

20 Claims, 10 Drawing Sheets

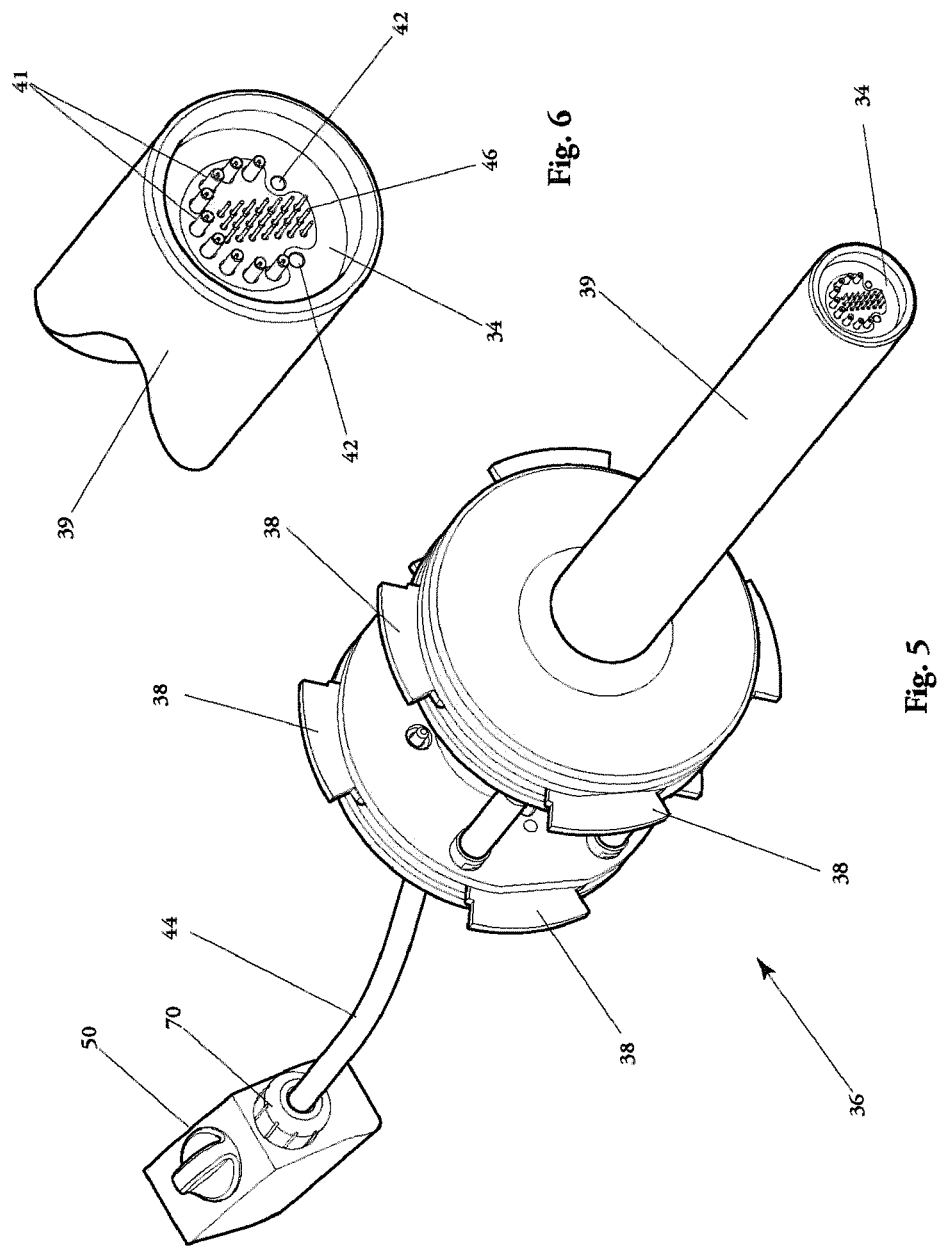

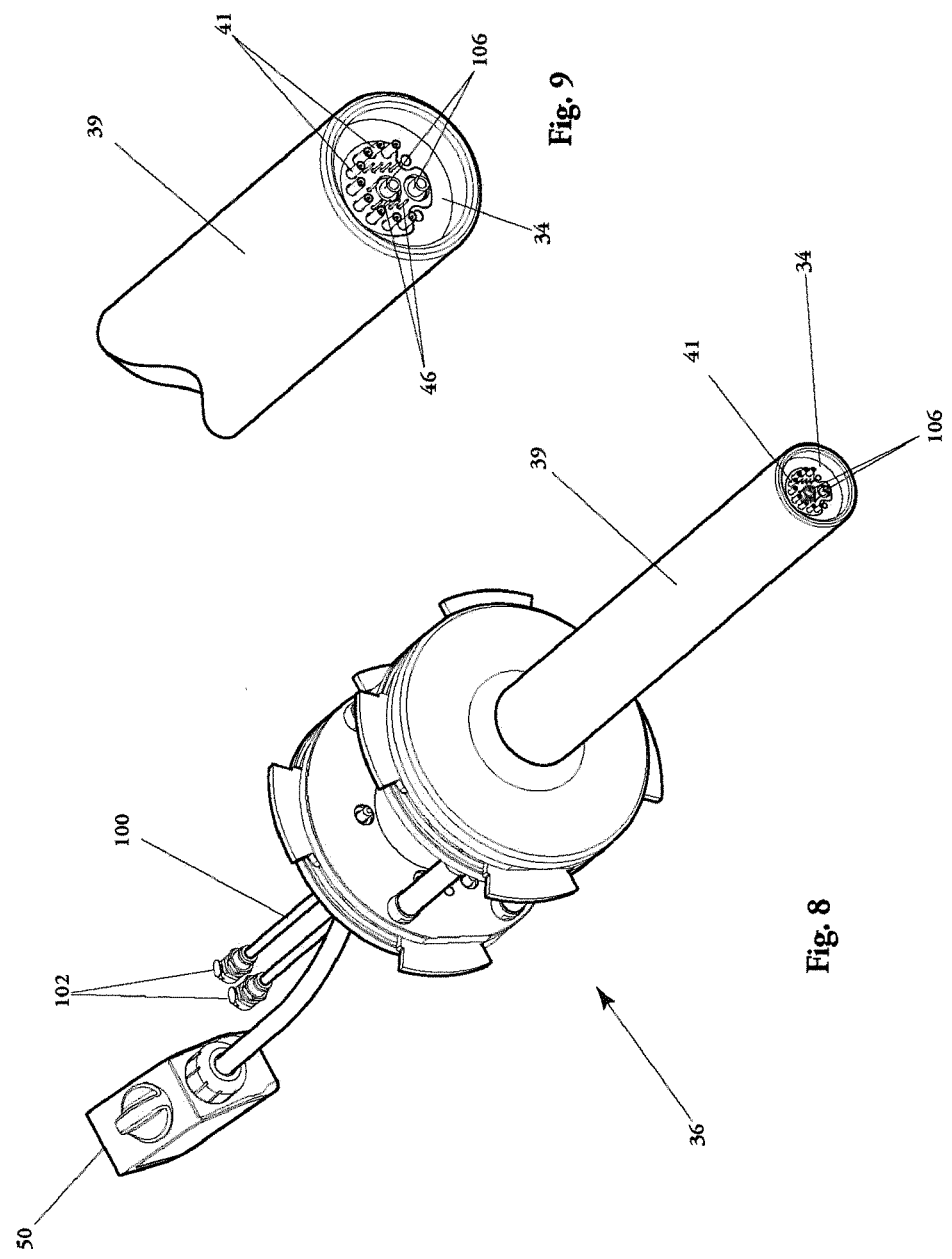

ELECTRICAL AND FLUID CONNECTION SYSTEM FOR MAGNETIC IMAGING

CROSS REFERENCE TO RELATED APPLICATION

This application claims the benefit and priority of U.S. provisional patent application No. 61/574,588, filed on Aug. 5, 2011 and which is incorporated herein by reference in its entirety.

BACKGROUND AND SUMMARY

Surface coils are used to improve the quality of images produced by magnetic resonance imaging machines (MRI machines). Surface coils transmit electrical signals produced by an object being imaged to external electronics such as signal amplifiers and imaging software and can support faster imaging speeds. In many cases, the more surface coils used, the better is the quality of a resulting image and the faster is the imaging sequence.

When one or more surface coils are used to produce an image, it becomes more difficult to accommodate the required wires and connectors needed to transmit signals from the surface coils to the external electronics and software located outside of the imaging bore. This is because the space within the bore of an MRI machine is relatively limited, particularly around the "front" end of the imaging bore through which a specimen is inserted.

In order to accommodate and facilitate the electrical interconnections of one or more surface coils located within the bore of an imaging machine with imaging hardware, electronics, and software located outside of the imaging bore of an MRI (or other imaging machine), a convenient electrical connection system has been developed as described below.

A current trend in surface coil design is to cool or super cool the surface coils for improved imaging. This cooling can be facilitated by providing cooking fluid around or over the surface coils. At the same time, a need exists for warming live laboratory specimens, such as mice and rats, during imaging. The bores of imaging machines can become cold due to the super cooled main magnets and field coils surrounding the imaging bore to the point where live specimens can become undesirably cold.

As further described below, a fluid connection system can be provided through a rear portion of an imaging bore as a stand alone fluid system or combined with an electrical connection system. Surface coil cooling fluid, specimen warming fluid, anesthesia gas and/or pressurized air and other gasses can be introduced and/or exhausted through one or more fluid pathways extending outwardly from the rear portion of an imaging bore. By providing fluid channels or pathways through the rear portion of an imaging bore, the limited space available through the front of the imaging bore can be devoted to other purposes without crowding or obstructing the front portion of the imaging bore.

BRIEF DESCRIPTION OF THE DRAWINGS

In the drawings:

FIG. 5 is an enlarged perspective view of the bore mounting assembly of FIG. 1;

FIG. 6 is a partial enlarged perspective view of the free end portion of the bore mounting assembly of FIG. 5 showing details of the electrical connectors;

FIG. 8 is a perspective view of an alternate embodiment of the bore mounting assembly of FIG. 5 wherein fluid conduits have been added to the bore mounting assembly;

FIG. 9 is a partial enlarged perspective view of the free end portion of the bore mounting assembly of FIG. 8 showing the addition of fluid connectors to the bore mounting connector;

DESCRIPTION OF REPRESENTATIVE EMBODIMENTS

Figure 1:
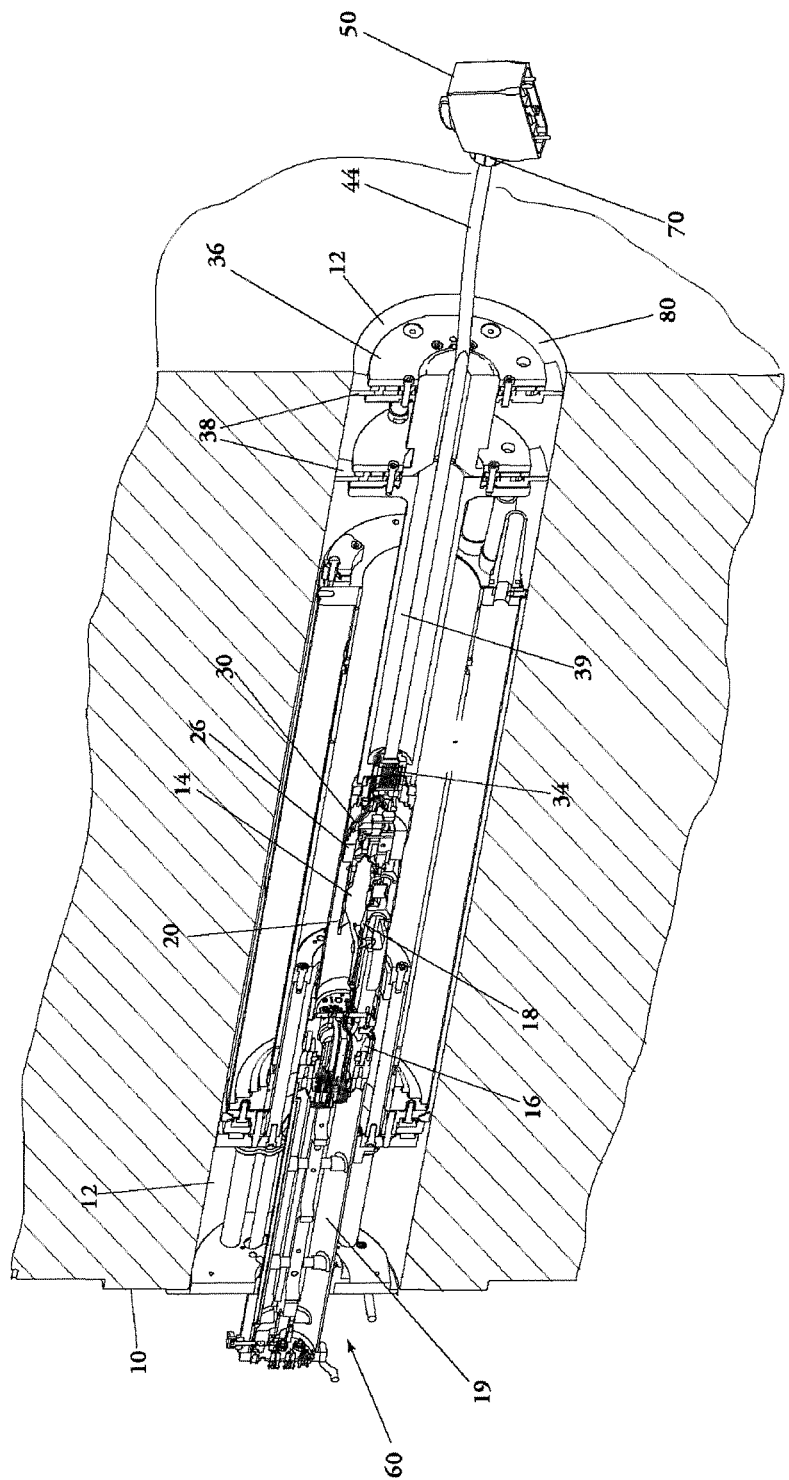
FIG. 1 is a partial perspective view in axial section of an animal holding system located in the bore of an imaging machine and showing an electrical and fluid connection system operatively connected to the animal holding system.

As seen in FIG. 1, an MRI imaging machine 10 includes an imaging bore 12 within which images are taken of a specimen 14, such as a laboratory animal, commonly a mouse or rat, although other specimens may also be imaged.

The specimen 14 is supported on a specimen holder or bed 18 such as disclosed in U.S. Pat. Nos. 7,414,403 and 7,534,067. The bed 18 is positioned within the imaging bore 12 via a releasable coupling 16 which couples the bed 18 to a positioning receiver assembly 19 as described in U.S. Pat. Nos. 7,414,403 and 7,534,067.

Figure 2:
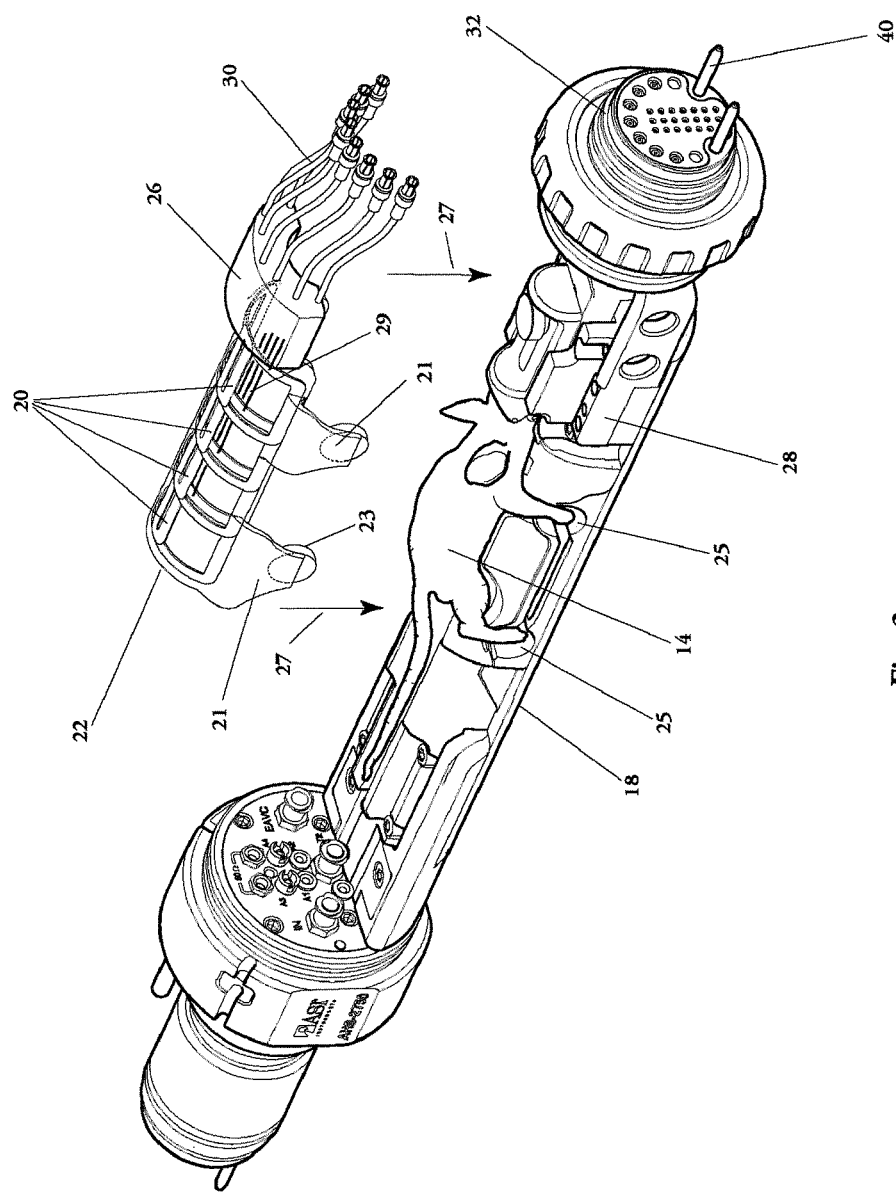
FIG. 2 is an enlarged exploded perspective view of the animal holder of FIG. 1 fitted with a first connector.

As seen in FIG. 2, eight surface coils 20 are positioned on a removable arched coil holder 22 which overlies or borders the specimen 14. Virtually any number of surface coils can be used, from one to a dozen or more. Holder 22 can be supported on the bed 18 with a resilient snap fit connection between flexible legs 21 and the bed 18. Pads 23 can be snap fitted into matching recesses 25 formed on the bed 18 by pushing the holder 22 downwardly over the bed 18 as indicated by directional arrows 27. This connection not only positions the holder 22 accurately on the bed 18, but also holds and immobilizes the specimen's feet against sensors located below the recesses 25.

Each coil 20 is electrically connected by one or more electrical conductive leads 29 to an electronics module 26 which may include electronic filters, preamplifiers, tuning circuitry, multiplexers and the like. Module 26 may also include an electro-optical converter which converts the electrical signals from the surface coils 20 to optical signals. Module 26 can be separately carried directly on the bed 18 in a fixed or detachable configuration or attached or mounted on and hard wired to the holder 22 as shown in an integral removable embodiment in FIG. 2.

Figure 3:
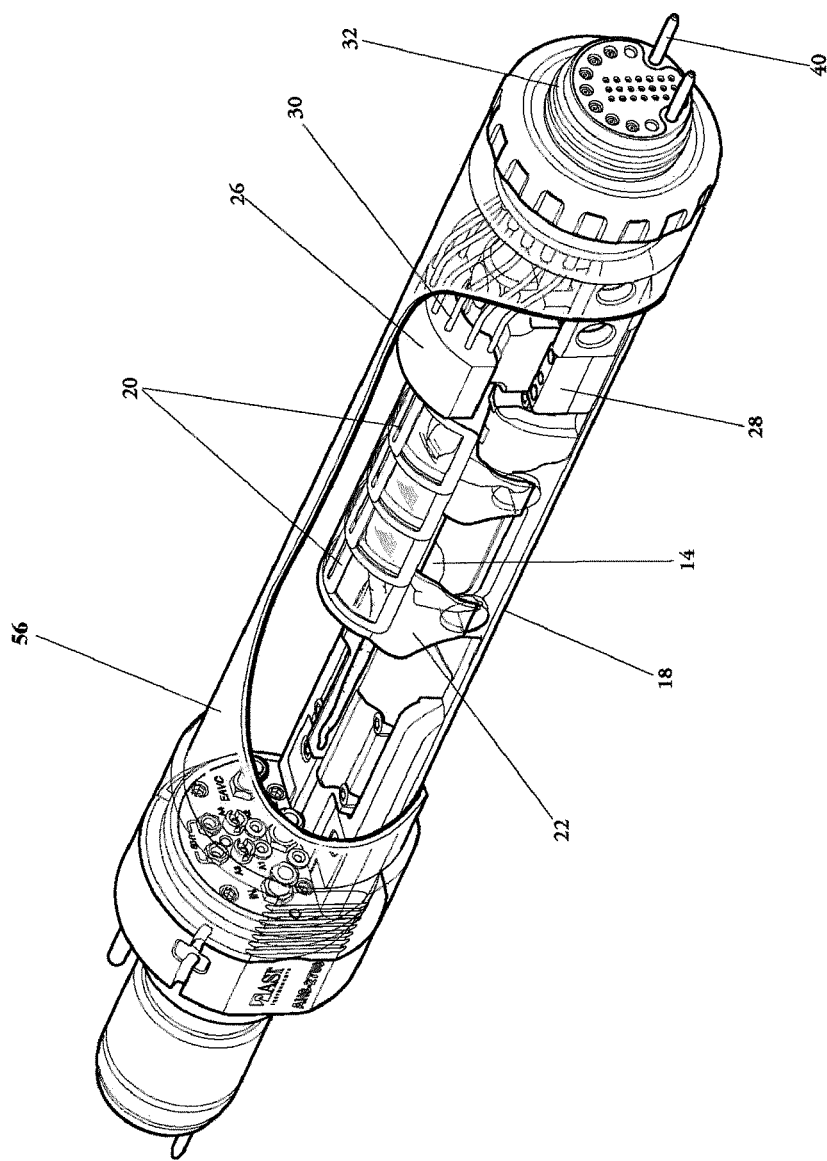
FIG. 3 is a perspective view of the animal holder of FIG. 2 with a hermetically sealed containment tube partially cut away for clarity.

In some applications, a hermetically sealed containment chamber 56 can surround and isolate the specimen 14 and bed 18, as well as the surface coils 20, module 26 and a portion of the first connector 32 as shown in FIG. 3. Chamber 56 can take the form of a clear plastic or glass tube as shown partially cut-away in FIG. 3. While chamber 56 is optional, it is typically used when a specimen 14 is contagious.

Figure 4:
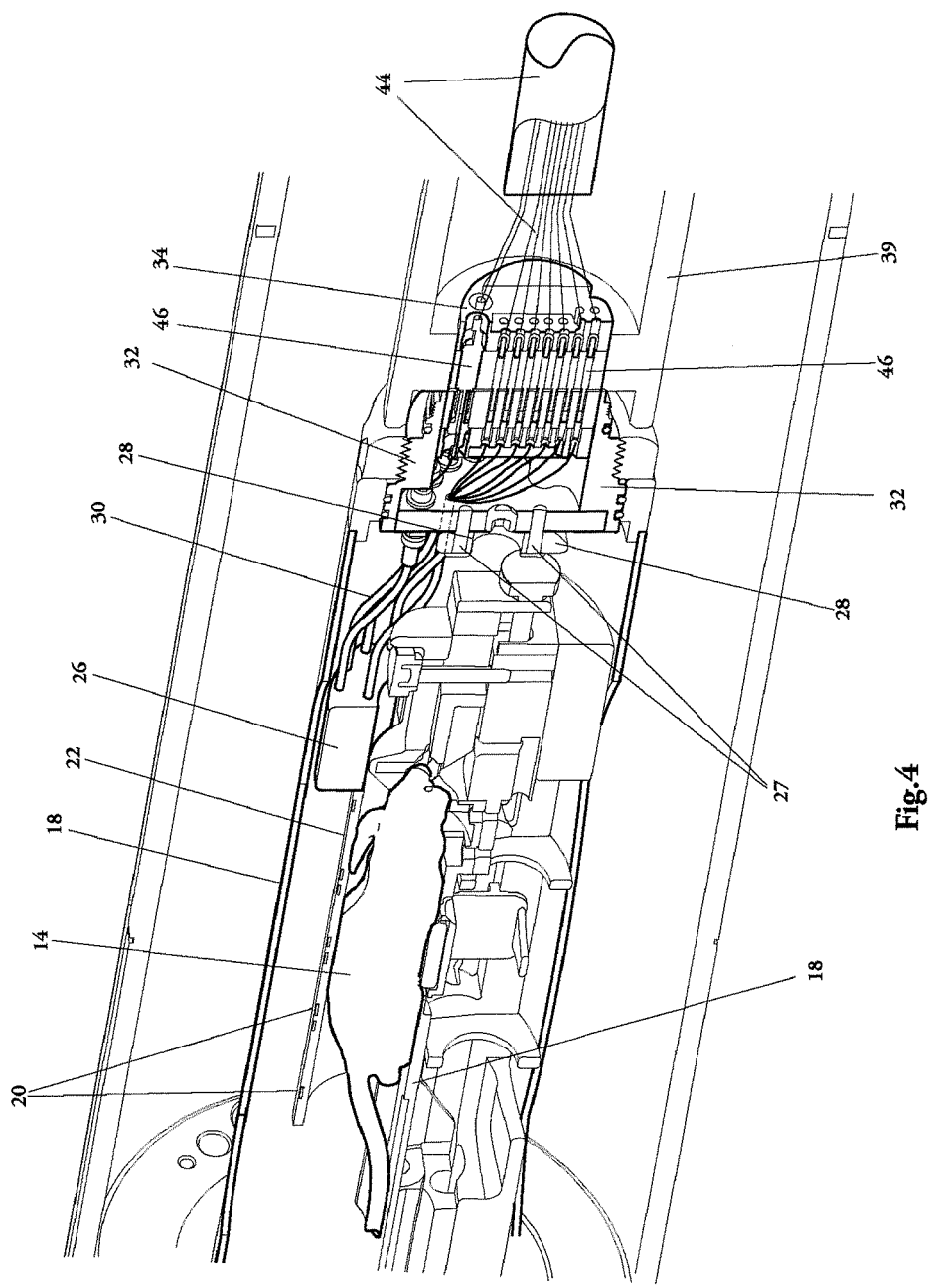
FIG. 4 is an enlarged view of a portion of FIG. 1 showing details of the electrical interconnection system.

As seen in FIG. 4, wires 30 extending from the module 26 to a female electrical connector assembly 32 respectively carry the individual signals from each surface coil 20 to a mating male electrical connector 34 (FIG. 5). The wires 30 can be removably connected to and disconnected from the female connector 32 with a manual axial push and pull. If the module 26 produces optical signals, a single optical fiber or lead 30 may be used to send imaging signals to a male optical connector 34. The female connector 32 is shown fixed on or to the bed 18 with a U-shaped or yoke-shaped bracket 28 (FIG. 3) with fasteners 27 (FIG. 4). Bracket 28 extends along both sides of bed 18 and around its front end.

The male electrical connector 34 is carried on a rear bore mounting assembly 36 (FIG. 5) which includes cam-driven radially-adjustable arms 38 for selectively locking the bore mounting assembly 36 in a desired axial position within the bore 12. Alignment pins 40 (FIGS. 3 and 7) are provided on the female connector 32 to nest within alignment sockets or keyhole bores 42 (FIG. 6) formed in the male connector 34. The bore mounting assembly 36 includes an elongated cantilevered connector arm 39 having a free end portion which holds the male coaxial connector pins 41 and DC connector pins 46 at its free end. Connector arm 39 allows an operator to axially insert the male connector 34 deeply within the bore 12 and thereby electrically interconnect the male and female connectors 32, 34.

As further seen in FIGS. 4 and 5, electrical wires or leads 44 connected to each respective male connector pin 41, 46 carry the signals from the surface coils 20 to external image processing equipment 50 located outside of the imaging bore 12. If the electrical signals from the surface coils 20 are converted to optical signals in module 26, then a single fiber optic lead 30 and a single fiber optic lead 44 can be used to transmit imaging data to processor 50.

In use, a specimen 14 is inserted into the "front" end 60 (FIG. 1) of the MRI machine 10 and held in a predetermined fixed position on bed 18 such as described in U.S. Pat. No. 7,414,403. The integral bore mounting assembly 36 and male connector 34 is then inserted into bore 12 through the "rear" end 80 of the bore 12 and manipulated and adjusted to mate the sockets 42 in the male connector 34 with the alignment pins 40 on the female connector 32. The male connector 34 is then fully-axially inserted and mated with the female connector 32 so that an electrical signal can freely flow from each coil 20 to each input port 70 on the external image processing equipment 50.

In some cases, the male connector 34 can be fixed in position while two or more different specimens 14 on different beds 18 can be sequentially inserted into bore 12 with the female connectors 32 mated with the fixed male connector by insertion through the front end 60 of bore 12. The axial positions of the male and female connectors can be reversed if desired.

It can be appreciated that by sending imaging signals from the front end of the animal bed 18 directly rearwardly and outwardly through the rear end 80 of the imaging bore 12, the internal electrical wires 30 and the external electrical wires 44 need not extend or run to the front end 60 of the imaging bore 12 where space is at a premium. Thus, the space available through the rear end 80 of the imaging bore is effectively used to carry wires 44 in a convenient and user-friendly manner.

Figure 7:
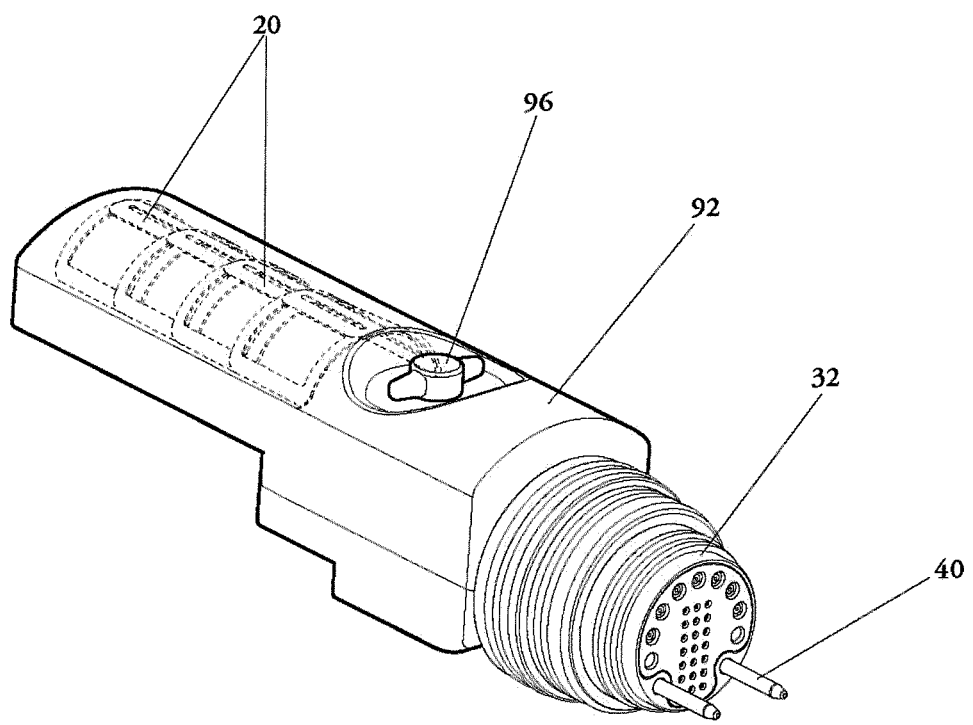
FIG. 7 is a perspective view of an integral surface coil holder, electronics module and electrical connector.
Figure 10:
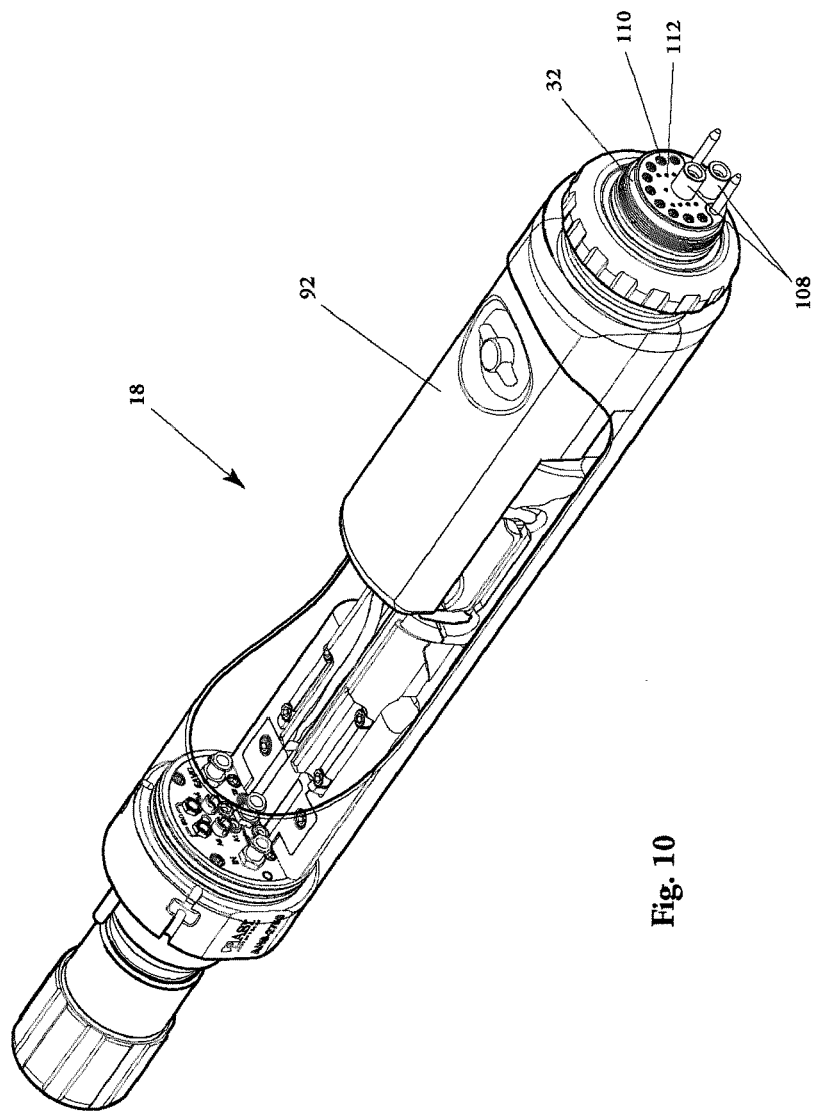
FIG. 10 is a partially cut way top perspective view of the animal holder of FIG. 2 provided with a connector having fluid connectors fluidly communicating with the interior of the containment chamber and/or with the specimen.

Another embodiment of this disclosure is shown in FIG. 7 wherein the female connector 32 and the surface coils 20 are provided as an integral modular coil and connector assembly with the surface coils 20 mounted on or within a housing 92. Housing 92 can be easily mounted and removed from the animal bed 18 with a simple threaded hand screw 96.

Another embodiment of the MRI connection system is shown in FIGS. 8-12 wherein the connection system described above is adapted to conduct fluids into and/or out of the rear end 80 of the imaging bore 12. In particular, as seen in FIG. 8, one or more external fluid conduits or tubes 100 are provided on the bore mounting assembly 36. External fluid connectors 102 are mounted on the free ends of the external tubes 100 for connection to a source of fluid and/or to an exhaust chamber or ambient.

As noted above, heating fluid, cooling fluid, anesthesia gas, pressurized gas or other gasses and/or liquids can pass inwardly and/or outwardly through the tubes 100. Tubes 100 extend completely through the bore mounting assembly 36 and its connector arm 39 and are attached to fluid connectors 106 on connector 34.

The fluid connectors 106 are constructed to form a fluid tight or hermetic connection with one or more mating fluid connectors 108 (FIG. 10) provided on the mating connector 32. The male connector pins 41, 46 of FIG. 9 are aligned to mate with the sockets 110, 112 on connector 32.

Figure 11:
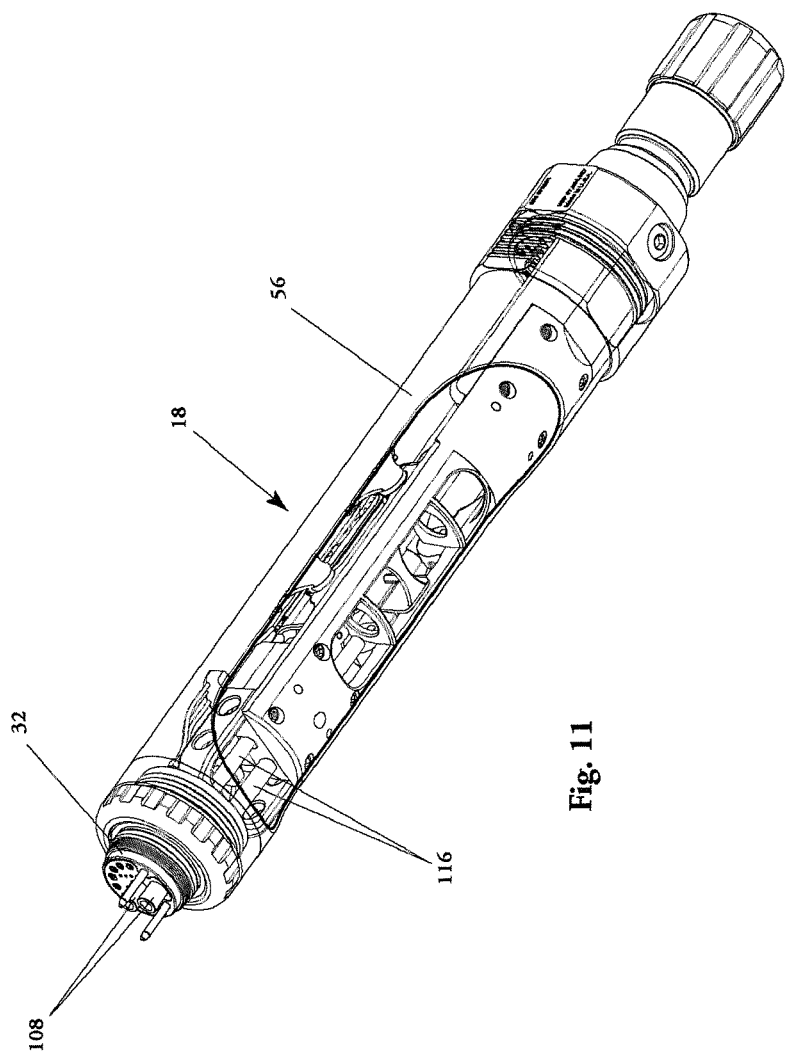
FIG. 11 is a partially cut away bottom perspective view of FIG. 10.

As seen in FIG. 11, fluid conduits, passageways or tubes 116 are fluidly connected to the fluid connectors 108 on the connector 32 for directing fluid to and/or from the interior of chamber 56. Cooling fluid can be directed through tubes 116 and over the surface coils 20, heating fluid and/or anesthesia gas can be directed over the specimen 14, and/or pressurized gas can be directed into and/or out of the chamber 56 via tubes 116. While two tubes 116 are shown, one, two or more fluid pathways and tubes can be provided in the manner shown.

Figure 12:
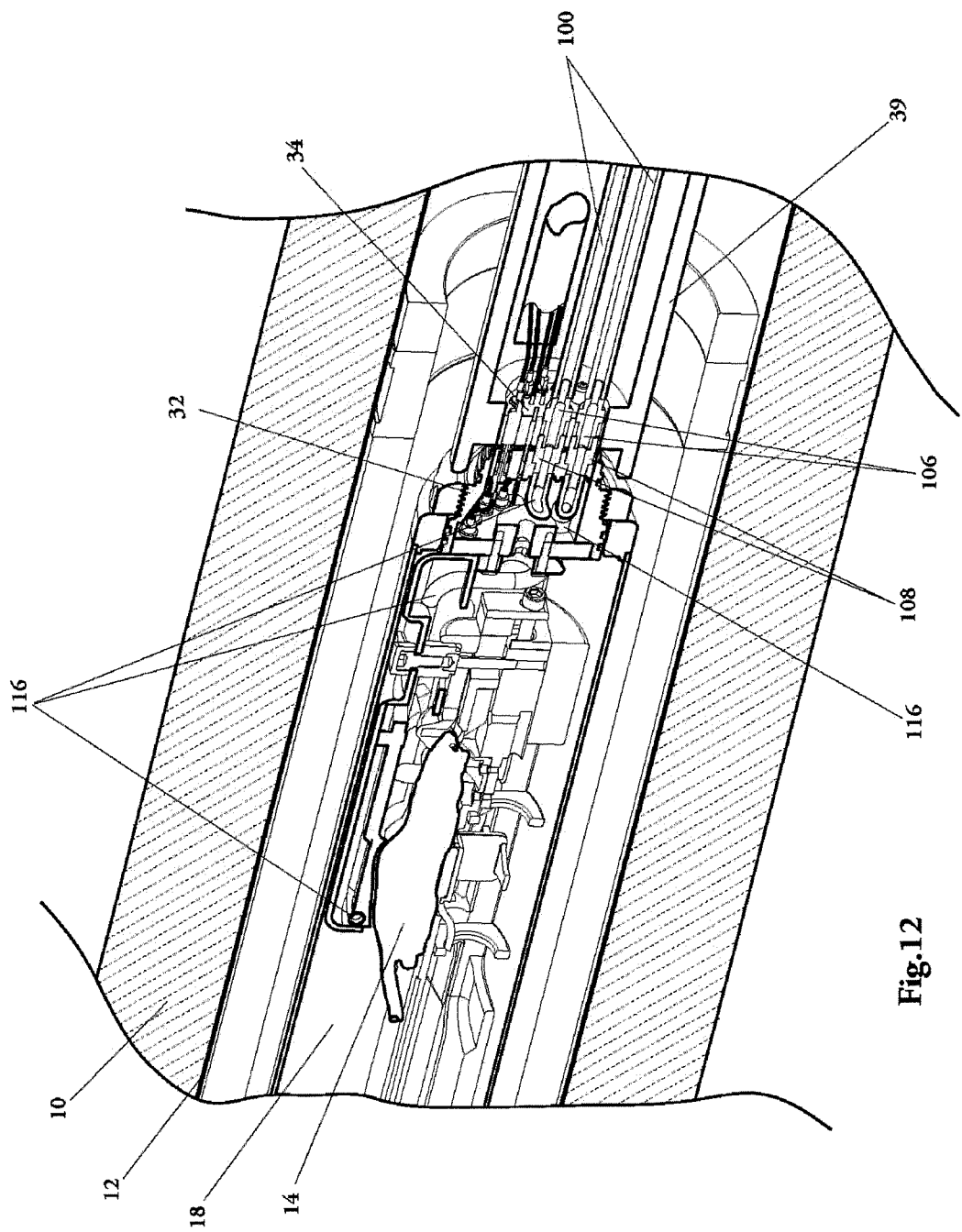
FIG. 12 is a partial perspective view in axial section showing the formation of fluid passages through a pair of connectors.

Details of the fluid interconnection between connectors 32, 34 are shown in FIG. 12.

It will be appreciated by those skilled in the art that the above electrical and fluid connection systems for magnetic imaging are merely representative of the many possible embodiments of the disclosure and that the scope of the disclosure should not be limited thereto, but instead should only be limited according to the following claims.

What is claimed is:

1. A connection system for sending imaging signals from within an imaging bore of an imaging machine outwardly through a rear portion of an imaging bore, said system comprising:
   a specimen holder insertable through a front portion of an imaging bore;
   an imaging surface coil disposed adjacent said specimen holder;
   an electronic module for receiving and processing imaging signals from said imaging surface coil;
   a first connector for receiving imaging signals from said electronic module;
   a bore mounting assembly comprising a second connector releasably connectable to said first connector; and
   said bore mounting assembly being insertable through a rear portion of an imaging machine for receiving imaging signals from said first connector and for sending imaging signals outwardly through a rear portion of an imaging bore.

2. The system of claim 1, further comprising a plurality of imaging surface coils disposed adjacent said specimen holder.

3. The system of claim 1, further comprising an electrical lead electrically connecting said imaging surface coil and said electronic module.

4. The system of claim 1, further comprising a coil holder removably mountable on said specimen holder, and wherein said surface coil is mounted on said coil holder.

5. The system of claim 4, wherein said electronic module is attached to said coil holder.

6. The system of claim 1, wherein said electronic module comprises at least one of an electronic filter, a preamplifier, a tuning circuit, a multiplexer and an electro-optical converter.

7. The system of claim 1, wherein said electronic module is carried on said specimen holder.

8. The system of claim 1, wherein said first and second connectors comprise fluid connectors for the passage of fluid therethrough.

9. The system of claim 1, wherein said first and second connectors comprise electrical connectors.

10. The system of claim 1, wherein said first and second connectors comprise optical connectors.

11. The system of claim 1, wherein said bore mounting assembly comprises an elongated connector arm having a free end portion and carrying said second connector on said free end portion.

12. The system of claim 1, wherein said first connector is carried on said electronic module.

13. The system of claim 1, wherein said bore mounting assembly further comprises a locking arm for locking said bore mounting assembly in an imaging bore.

14. The system of claim 13, wherein said bore mounting assembly further comprises a plurality of radially-adjustable locking arms.

15. The system of claim 1, wherein said bore mounting assembly further comprises an external lead constructed to extend outwardly of an imaging bore for sending imaging signals outwardly from a rear portion of an imaging bore.

16. The system of claim 15, further comprising external imaging processing equipment connected to said external lead for receiving imaging signals.

17. The system of claim 1, wherein said electronic module comprises an electro-optical converter and said first and second connectors comprise optical connectors.

18. The system of claim 1, further comprising a fluid tube extending along said specimen holder and fluidly communicating through said first and second connectors.

19. The system of claim 1, further comprising a fluid tube extending along said bore mounting assembly and fluidly communicating through said first and second connectors.

20. A method of connecting a surface coil within a bore of an imaging machine to image processing equipment located externally of the bore, wherein the bore has a front end portion and a rear end portion, and wherein said method comprises:
  inserting a specimen through said front end portion of said bore;
  providing an electronic module in said bore;
  sending imaging signals from said surface coil to said electronic module;
  sending imaging signals from said electronic module to a first connector disposed in said bore;
  connecting a second connector in said bore to said first connector;
  sending imaging signals through said first and second connectors to a bore mounting assembly mounted within said bore; and
  sending imaging signals through said bore mounting assembly outwardly from said rear end portion of said bore to imaging processing equipment located externally of said bore and producing an image with said imaging signals.

* * * * *